United States Patent
Zhang et al.

(10) Patent No.: US 9,653,577 B2
(45) Date of Patent: May 16, 2017

(54) DILUTED DRIFT LAYER WITH VARIABLE STRIPE WIDTHS FOR POWER TRANSISTORS

(71) Applicant: Texas Instruments Incorporated, Dallas, TX (US)

(72) Inventors: Yongxi Zhang, Plano, TX (US); Sameer P. Pendharkar, Allen, TX (US); Scott G. Balster, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/220,910

(22) Filed: Jul. 27, 2016

(65) Prior Publication Data
US 2016/0336427 A1   Nov. 17, 2016

Related U.S. Application Data

(62) Division of application No. 14/671,572, filed on Mar. 27, 2015, now Pat. No. 9,431,480.

(51) Int. Cl.
*H01L 29/66* (2006.01)
*H01L 29/78* (2006.01)
(Continued)

(52) U.S. Cl.
CPC .. *H01L 29/66681* (2013.01); *H01L 21/76224* (2013.01); *H01L 27/092* (2013.01);
(Continued)

(58) Field of Classification Search
CPC ............ H01L 29/66795; H01L 29/785; H01L 29/4238; H01L 29/0696; H01L 27/0207
See application file for complete search history.

(56) References Cited

U.S. PATENT DOCUMENTS 5,386,136 A * 1/1995 Williams ............ H01L 29/1079
257/104
8,643,099 B2   2/2014 Denison et al.
(Continued)

FOREIGN PATENT DOCUMENTS

EP   1286399 A2   2/2003
GB   2294584 A   5/1996

*Primary Examiner* — Quoc Hoang
(74) *Attorney, Agent, or Firm* — Jacqueline J. Garner; Charles A. Brill; Frank D. Cimino

(57) ABSTRACT

A multi-finger lateral high voltage transistors (MFLHVT) includes a substrate doped a first dopant type, a well doped a second dopant type, and a buried drift layer (BDL) doped first type having a diluted BDL portion (DBDL) including dilution stripes. A semiconductor surface doped the second type is on the BDL. Dielectric isolation regions have gaps defining a first active area in a first gap region (first MOAT) and a second active area in a second gap region (second MOAT). A drain includes drain fingers in the second MOAT interdigitated with source fingers in the first MOAT each doped second type. The DBDL is within a fingertip drift region associated drain fingertips and/or source fingertips between the first and second MOAT. A gate stack is on the semiconductor surface between source and drain. The dilution stripes have stripe widths that increase monotonically with a drift length at their respective positions.

5 Claims, 5 Drawing Sheets

(51) Int. Cl.
*H01L 29/10* (2006.01)
*H01L 27/092* (2006.01)
*H01L 21/762* (2006.01)
*H01L 29/06* (2006.01)
*H01L 21/266* (2006.01)

(52) U.S. Cl.
CPC ...... *H01L 29/0623* (2013.01); *H01L 29/0692* (2013.01); *H01L 29/1095* (2013.01); *H01L 29/7816* (2013.01); *H01L 21/266* (2013.01); *H01L 29/063* (2013.01); *H01L 29/0653* (2013.01)

(56) References Cited

U.S. PATENT DOCUMENTS

| | | |
|---|---|---|
| 8,969,913 B2 | 3/2015 | Huo et al. |
| 2008/0265319 A1 | 10/2008 | Eggenkamp et al. |
| 2008/0296678 A1 | 12/2008 | Kim |
| 2012/0100679 A1 | 4/2012 | Sridhar et al. |

\* cited by examiner

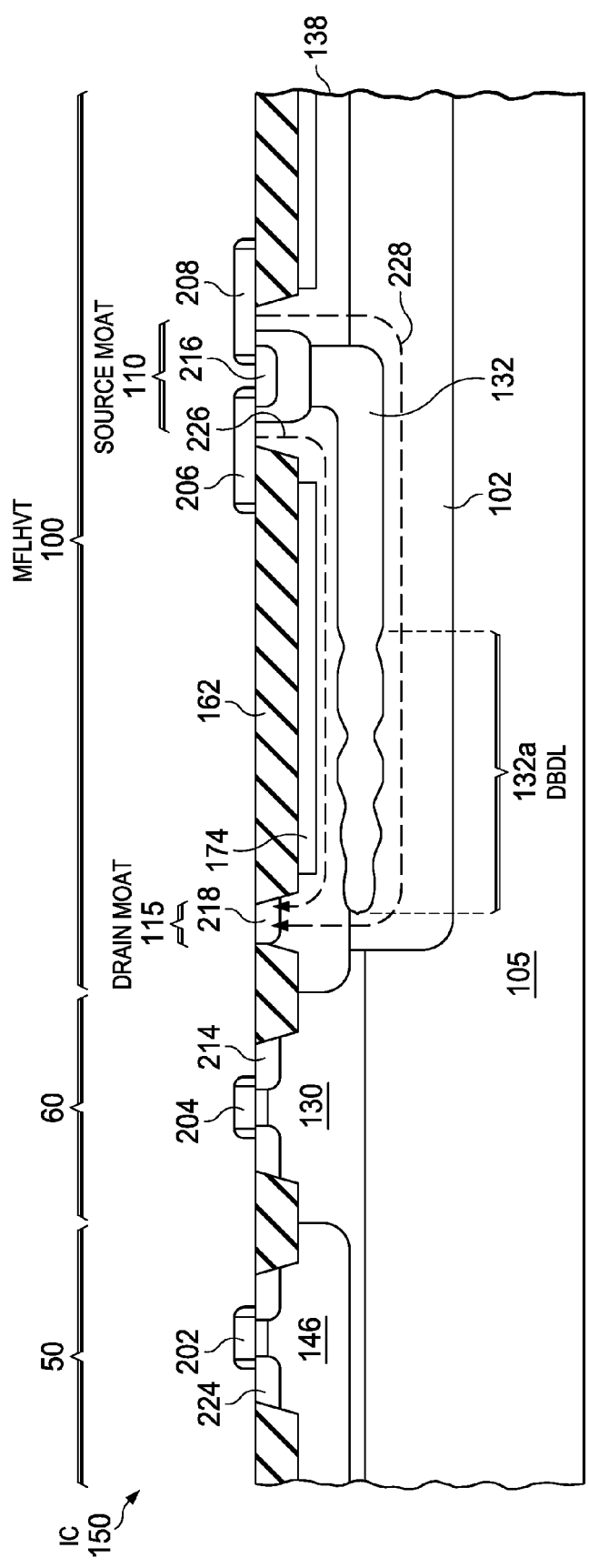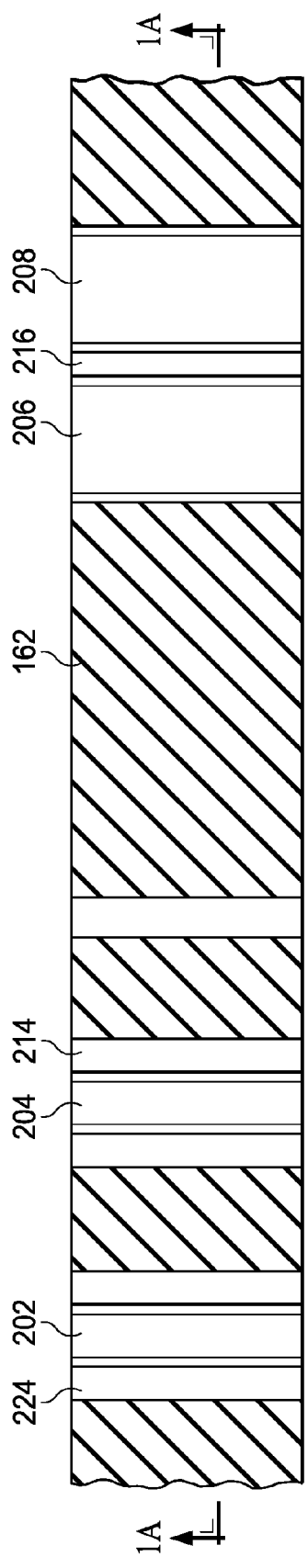
FIG. 1A
FIG. 1B

DILUTED DRIFT LAYER WITH VARIABLE STRIPE WIDTHS FOR POWER TRANSISTORS

CROSS REFERENCE TO RELATED APPLICATIONS

This application is a divisional of U.S. Nonprovisional patent application Ser. No. 14/671,572, filed Mar. 27, 2015, the contents of which are herein incorporated by reference in its entirety.

FIELD

Disclosed embodiments relate to lateral high voltage metal oxide semiconductor (MOS) power transistors having diluted drift layers, including LDMOS and DeMOS transistors.

BACKGROUND

Modern digital very-large-scale integration (VLSI) circuits commonly operate at supply voltages of around 2.5 volts or below. However, certain integrated circuits (ICs) call for additional on-chip circuits operating at higher voltages. Example circuits are input/output (IO) interface circuits with various off-chip system components such as power management switches, analog input circuits conditioning transducer signals, or output analog drive functions for speakers or other actuators.

One solution to this problem is to use multiple different gate oxide thicknesses and to build both low voltage transistors and high voltage transistors on the same IC chip. This method increases process complexity and cost. An alternative solution is to use lateral asymmetric source and drain MOS transistors having a lightly doped n-type gap between the drain and gate (for n-type devices) to enable use of higher drain to source voltages, such as laterally diffused Metal-Oxide-Semiconductor (LDMOS) or drain-extended MOS (DeMOS) which have drain structures capable of operating at higher voltages as compared to conventional symmetric MOS transistors.

In an LDMOS transistor a lightly doped lateral diffused drain region is constructed between the heavily doped drain contact and the transistor channel region. As the name implies, a lateral current is created between drain and source. A depletion region forms in this lightly doped lateral diffused region resulting in a voltage drop between the drain contact and the transistor gate. With proper design, sufficient voltage may be dropped between the drain contact and the gate dielectric to allow a low gate voltage transistor to be used as a switch for the high voltage.

Some lateral power transistors include "RESURF" regions which is short for reduced surface electric field regions. For purposes of this patent application, the term "RESURF" is understood to refer to a material which reduces an electric field in an adjacent surface semiconductor region. A RESURF region may be for example a buried semiconductor region (or layer) with an opposite conductivity type from the adjacent semiconductor region (or layer). RESURF structures are described in Appels, et. al., "Thin Layer High Voltage Devices" Philips J, Res. 35 1-13, 1980. The RESURF region(s) for lateral power transistors are generally referred to as buried drift regions.

To raise the breakdown voltage of the lateral power transistor a diluted buried drift layer may be used in the drift region at one end of the transistor, which can be formed by a masked implant that enables implanting dilution stripes separated by masked (non-implanted) stripes. One or more high temperature annealing processes follow which results in dopant from the implanted stripes diffusing into the non-implanted stripes which create more heavily doped stripes alternating with less heavily doped stripes.

The DEMOS or LDMOS transistor can have a multi-finger layout with a plurality of source and drain fingers generally interdigitated with one another, or in racetrack layout which is in essence a single finger design with an enclosed source or an enclosed drain. The diluted buried drift layer for diluted buried drift layer designs generally sets the drain-to-source breakdown voltage (BVDSS) for the lateral power transistor, with the racetrack layout generally providing a higher breakdown voltage that is near the ideal (planar) junction breakdown voltage due to less junction curvature as compared to a lower BVDSS for the multi-finger layout having higher curvature at the fingertip regions. Fingertip regions correspond to the curved distal end of the fingers that extend from linear (un-curved) regions of the fingertip Advantages of multi-finger lateral power transistors (e.g., DEMOS or LDMOS transistors) include decreased parasitics effects and the ability to change width (W), length (L), number of fingers, and number of contacts, which helps speed the transistor layout process.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize for multi-finger lateral high voltage transistors (MFLHVTs) including drain extended MOS (DEMOS) and laterally diffused MOS (LDMOS) transistors having a conventional diluted buried drift layer between the source and drain fingertips of the fingers referred to herein as the fingertip drift region "FDR", the use of a fixed overdesign dimension (scaling, such as 200%) for the dilution stripe width (e.g., at the drain end for n-channel Metal-Oxide-Semiconductor (NMOS)) of the FDR can limit the drain-to-source breakdown voltage (BVDSS) of these transistors. This reduced BVDSS has been found to be due to the significant curvature induced electric field crowding present at the FDR, particularly at the highest junction curvature portions, which has been verified by Emission Microscopy Imaging (EMMI) used to detect and localize certain integrated circuit (IC) failures. For example, the BVDSS of a multi-finger LDMOS can be about 100V lower at about 700V as compared to the otherwise equivalent racetrack version which has a BV close of about 800V which is the ideal BVDSS due to a large endcap radius.

Disclosed embodiments provide a calculation (formula)-based diluted buried drift layer (DBDL) design in the FDR for MFLHVTs which provides a monotonically increasing overdesign dimension (MIOD) for the dilution stripe width along at least a portion of the DBDL which is within the FDR associated with source fingertips and/or drain fingertips. The dilution stripe width corresponds to implanted buried drift layer regions. Disclosed DBDL designs have been found to improve the BVDSS of such transistors by relieving electric field crowding in the highest junction curvature portions of the FDR. Disclosed integrated circuits (ICs) can combine both n-type dilution for p-channel MOS (PMOS) MFLHVTs and p-type dilution for NMOS MFLHVTs.

BRIEF DESCRIPTION OF THE DRAWINGS

Reference will now be made to the accompanying drawings, which are not necessarily drawn to scale, wherein:

FIG. 1A is a cross sectional view of example IC having an n-channel MFLHVT with an example DBDL portion and multiple horizontal current channels, and FIG. 1B is a top down view of the IC shown in FIG. 1A, according to an example embodiment.

DETAILED DESCRIPTION

Figure 2A:
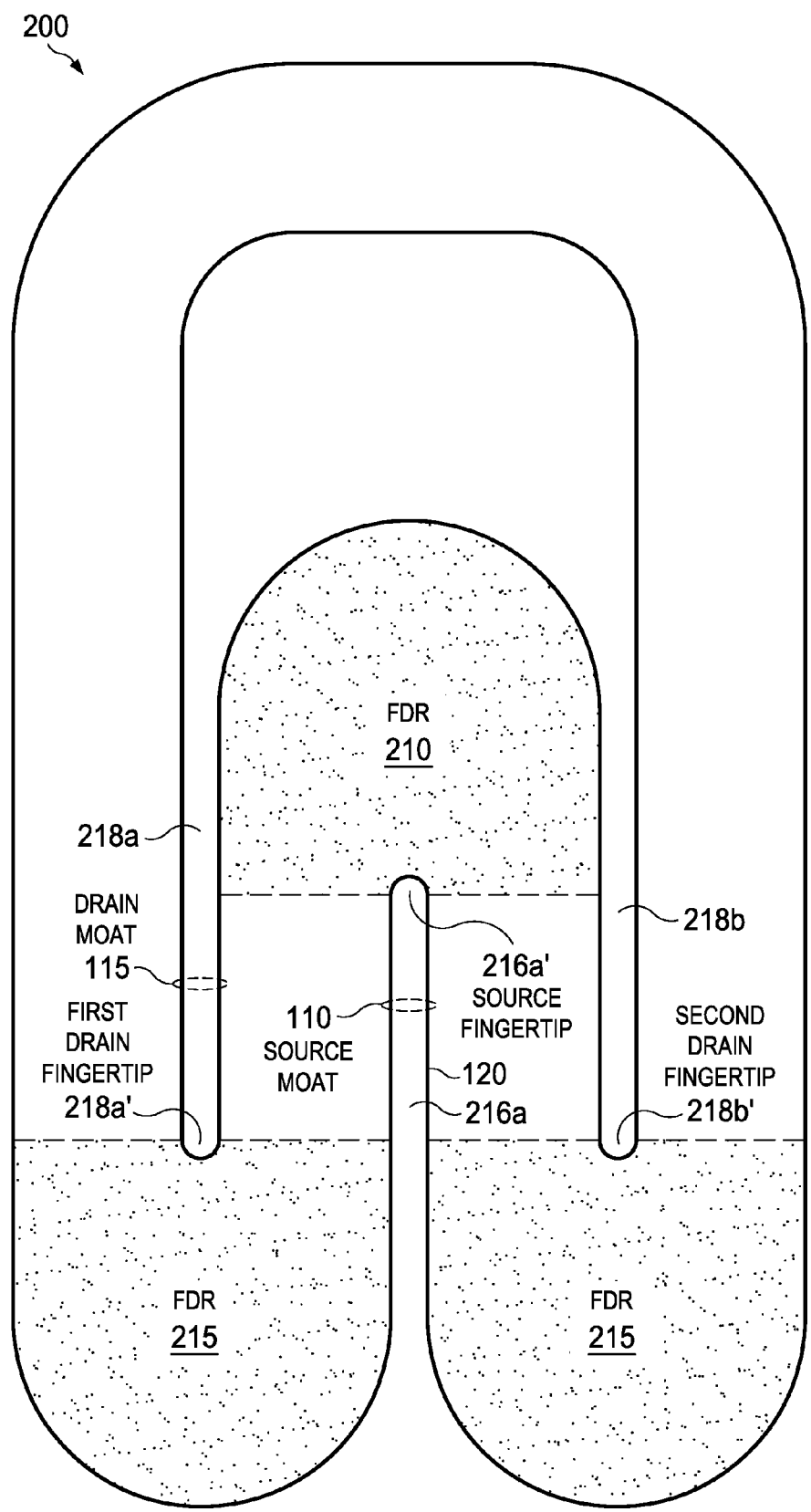
FIG. 2A depicts a portion of a disclosed MFLHVT showing a source finger having a source fingertip between a first drain finger and a second drain finger having a drain fingertip, respectively, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Disclosed embodiments include MFLHVTs that have a DBDL design in the FDR having an MIOD, which has been found to improve the BVDSS by relieving electric field crowding. Disclosed MFLHVTs also provide high current at high voltage with reduced area by having multiple current channels between the source and drain. Since current in disclosed MFLHVTs may flow through multiple channels when disclosed transistors are turned ON, disclosed transistors provides high current with a reduced area. The multiple current channels feature significantly reduces the area required for MFLHVTs including LDMOS or DeMOS transistors, thereby significantly reducing cost.

The term "current channel" as used herein refers to a region of the semiconductor substrate through which current flows. One current channel is isolated from another current channel by a diffusion of an opposite dopant type. One current channel may be shorted to the other current channel at the ends of the diffusion of opposite dopant type which separates the two current channels.

An example IC 150 having an n-channel MFLHVT (MFLHVT 100) with a p-type BDL 132 including DBDL portion 132a at the drain end near the common drain 218 in the FDR adjacent to fingertips between interdigitated source and drain finger, with multiple horizontal current channels shown with dashed lines as upper current channel 226 and lower current channel 228 illustrated in a cross sectional view in FIG. 1A. Fingertip regions correspond to the curved distal end of the fingers that extend from linear (un-curved) regions of the fingertip. As noted above, a p-channel MFLHVT on the same IC such as IC 150 or another IC having n-type dilution may be realized by a reverse-tone device relative to MFLHVT 100.

A top down view of the same is shown in FIG. 1B. Upper current channel 226 is in the semiconductor surface 138 doped n-type between a top p-type surface layer 174 and BDL 132 which is p-type, while lower current channel 228 is in an nwell 102 between the BDL 132 and the substrate 105. Substrate 105 is doped a first dopant type being p-type and as noted above the semiconductor surface 138 is doped with the second dopant type being n-type. The vertical layer stack for MFLHVT has a pnpnp structure thus providing 4 reduced surface electric field (RESURF) regions. However, because the top p-type surface layer 174 shown in FIG. 1A is optional, the top p-type surface layer 174 can be removed (skipped in the process) to provide a disclosed MFLHVT having a pnpn structure thus having 3 RESURF regions.

The substrate 105 can comprise silicon, silicon-germanium, or other semiconductor material. One particular arrangement is an epitaxial silicon/germanium (SiGe) semiconductor surface on a silicon substrate 105.

A symmetric S/D core logic PMOS transistor 50 has an nwell 146, source/drain diffusions 224 and transistor gate 202, and a symmetric S/D core logic NMOS transistor 60 has a p-type epi layer 130, source/drain diffusions 214 and the transistor gate 204 shown. The MFLHVT 100 as shown has two gates electrodes 206 and 208, and as noted above upper current channel 226 and lower current channel 228, both between its common drain (drain) 218 and common source (source) 216. More than two horizontal current paths may be provided if desired. The gate electrodes 206 and 208 can comprises polysilicon, or alternatively metal.

When the gate including gate electrode 206 of the MFLHVT 100 is turned ON current flows through the upper current channel 226 between the top p-type surface layer 174 and the BDL 132. When the gate including the gate electrode 208 of the MFLHVT 100 is turned ON current flows through the upper current channel 226 and lower current channel 228. However, for power switching applications, the gate electrodes 206 and 208 may be shorted together to maximize the transistor ON-state current. Although two gates are shown in FIG. 1A, it is also possible to have a single gate supporting both the upper current channel 226 and the lower current channel 228 so that disclosed MFLHVTs need only one gate.

There are dielectric isolation regions 162 at least partially in the semiconductor surface shown as trench isolation (e.g., shallow trench isolation (STI)) which can alternatively be field oxidation (FOX), including over the semiconductor surface 138, p-type epi layer 130 and nwell 146 of the IC 150 having gaps in the dielectric defining a first active area in a first dielectric gap region (hereafter source MOAT) 110 where a common source 216 is formed and a second active area in a second dielectric gap region (hereafter drain MOAT) 115 where the drain 218 is formed. The current channels 226, 228 are both shown sharing source 216 and drain 218. The current channels 226, 228 are tapered and are narrower and more lightly doped near the common drain 218 as compared to their doping and width near the common source 216.

When gates including gate electrode 206 and 208 are both turned OFF and high voltage is applied to the common drain 218, an expanded depletion region forms between the upper current channel 226 which is n-type and the p-type surface layer 174 and BDL 132 and an expanded depletion region forms between the lower current channel 228 which is n-type and the BDL 132 and the substrate 105, so that upper current channel 226 and lower current channel 228 no longer provide a continuous current path from the common source 216 to common drain 218. Sufficient voltage is dropped across these depletion regions so that the transistor gates stacks including gate electrodes 206 and 208 may utilize the same low voltage gate dielectric as the logic transistors 50 and 60 to switch the high voltage.

FIG. 2A depicts a portion 200 of a disclosed MFLHVT showing an interdigitated fingertip arrangement including a source finger 216a having a source fingertip 216a' between a first drain finger 218a and a second drain finger 218b having a drain fingertips 218a' and 218b', respectively. The MFLHVT will have a plurality of repetitions of the interdigitated finger arrangement shown. Associated with the source fingertip 216a' is the source FDR shown as 210 in FIG. 2A between an outer edge of the drain moat 115 and an outer edge of the source moat 110 is the DBDL portion 132a shown in FIG. 1A. Similarly, associated with drain fingertips 218a' and 219b' are respective drain FDRs 215 between the outer edge of the drain moat 115 and the outer edge of the source moat 110 which can also include a disclosed DBDL portion such as DBDL 132a. The dilution in FIG. 2A heavier on the side near the drain 218 equating to closer pitched dilution stripes with discernable stripes shown as compared to the degree of dilution on the side near the source 216 which is less is shown in FIG. 2A by non-discernable dilution stripes.

Figure 2B:
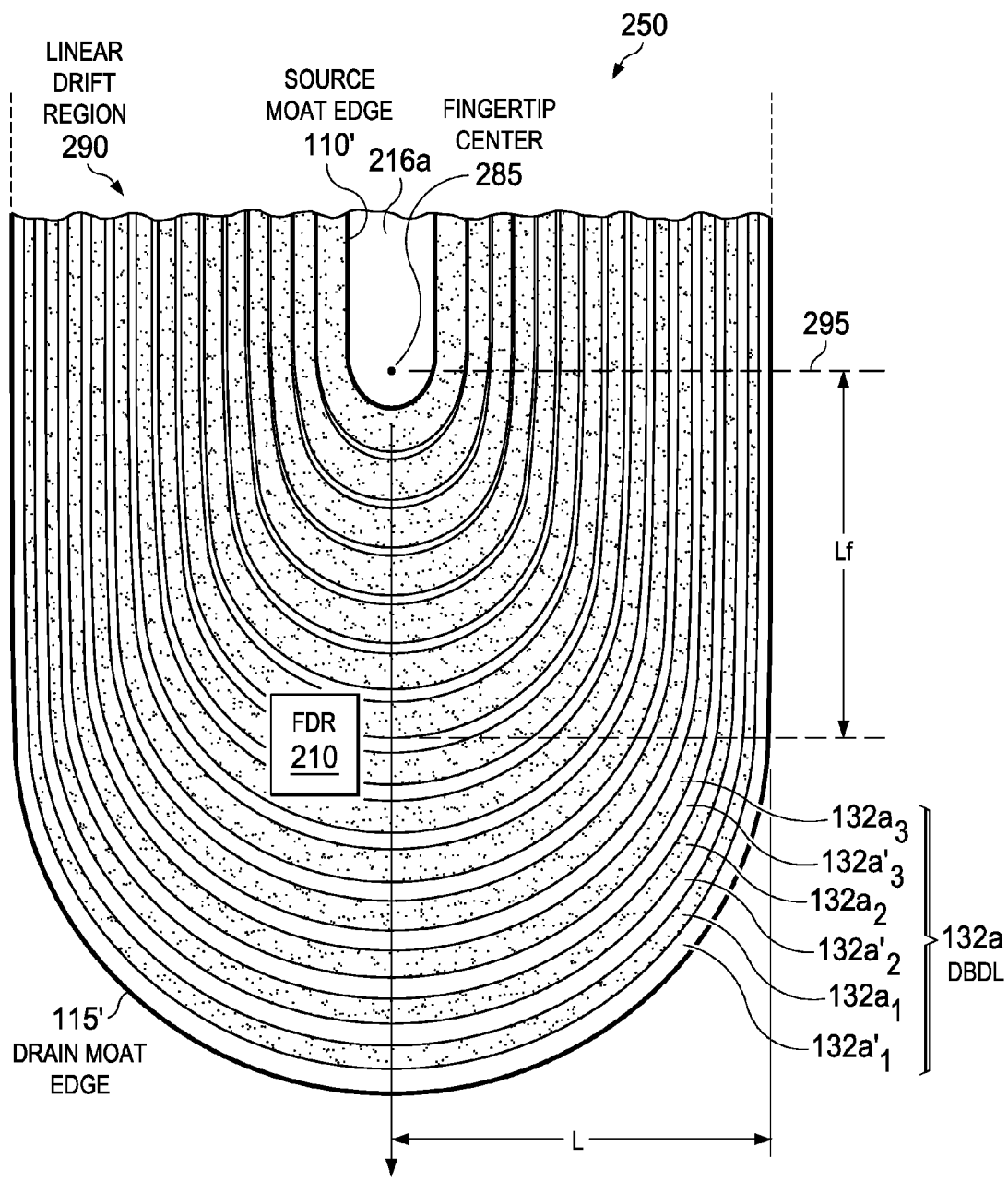
FIG. 2B is a top view depiction of the DBDL of a MFLHVT after BDL implant having a MIOD dilution stripe width design, with the dilution stripes corresponding to implanted regions with fifteen (15) example dilution stripes designed based on disclosed scaling in the FDR, according to an example embodiment.

FIG. 2B is a top view depiction 250 of the source FDR 210 in FIG. 2A showing an example DBDL portion 132a after BDL implant having a DBDL stripe widths corresponding to implanted regions which monotonically increase in size as a function of the drift length (DL) at that their location, according to an example embodiment. The fingertip center at the beginning of the source fingertip 216a' is identified and shown as 285, the linear drift region 290 is shown above the horizontal dashed line boundary shown as 295, and the source FDR 210 is below the horizontal dashed line 295.

Figure 3B:
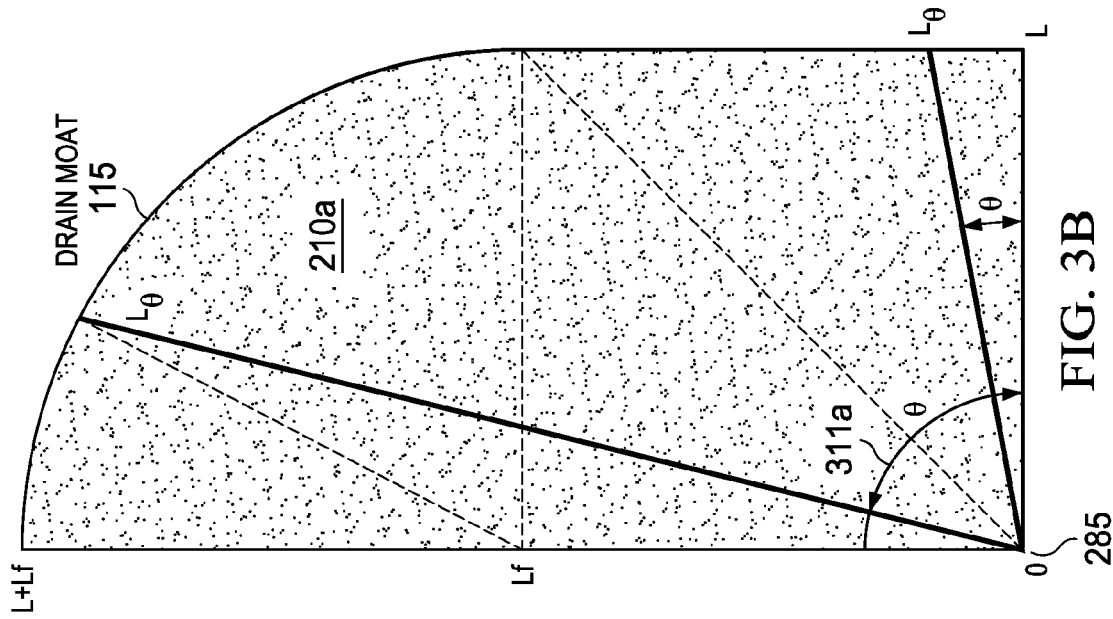
FIGS. 3A and 3B show a finger including a fingertip and a ½ of a fingertip portion, respectively, used to show parameters used in disclosed DBDL designs, according to an example embodiment.
Figure 3A:
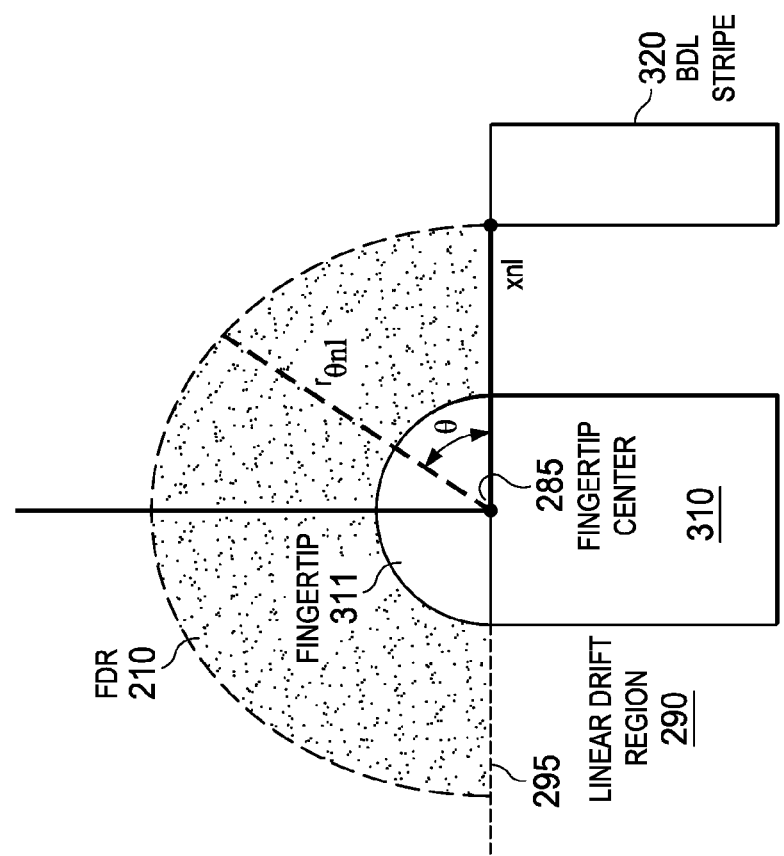

As used herein, DL is defined as the minimum spacing between the drain MOAT 115 and source MOAT 110, in the linear drift region being the shortest distance between source moat 110 and drain moat 115 (from source moat edge 110' to drain moat edge 115') which is a constant (shown as L), while in the source FDR 210 DL is defined as the distance between source moat edge 110' and drain moat edge 115' at the particular angle θ in the source FDR 210 (see FIGS. 3A and 3B showing θ). DBDL portion 132a is shown including 15 example diluted DBDL stripes with stripes $132a_1$, $132a_2$ and $132a_3$ identified in FIG. 2B that will be BDL implanted regions, alternating with non-implanted stripes $132a'_1$, $132a'_2$ and $132a'_3$ are non-implanted regions which are masked during the BDL implant.

The parameter Lf is shown in FIG. 2B which is the over design dimension for the dilution stripes, where Lf is a fixed parameter (constant) for a conventional fixed layout design which determines the overall size of the source FDR 210, and $L_θ$ is a variable in the FDR (see $L_θ$ shown in FIG. 3B described below) that sets the stripe width. For the particular layout shown in FIG. 2B, Lf is a fixed parameter while $L_θ$ varies with θ ranging from 0 degrees to 90 or 180 degrees.

The parameter L is also shown in FIG. 2B which is the distance from the edge of the source MOAT 110 to center of the finger (see L shown in FIG. 3B described below). As described in the examples, for a n-channel MFLHVT having a DBDL portion design such as shown in FIG. 2B, the BVDSS difference between multi-finger and racetrack (single finger) layouts has be found to be reduced from about 100 V to less than 40V.

When the MFLHVT comprises an NMOS device, for a constant distance from the fingertip center 285, the respective stripe widths of DBDLs 132a in FIG. 2B can be seen to increase with an increasing angle θ relative to the horizontal dashed line boundary 295 of the source FDR 210 with the linear drift region 290, having a maximum width at 90 degrees. However, the stripe width change with θ is opposite for the FDR associated with the drain fingertip such as the drain FDR 215 shown in FIG. 2A, where the respective stripe widths for the DBDL will decrease instead with an increasing angle θ. This asymmetry reflects the disclosed dilution concept in the linear region, such as for an NMOS MFLHVT where the p-type DBDL 132a is diluted more on drain side near drain 218 while the p-type DBDL 132a is diluted less on the source side near the source 216 as shown in FIG. 1A as described above.

Also for a fixed θ, as the distance from the fingertip center 285 increases, the width of the DBDLs 132a shown in FIG. 2B decreases, which as with the stripe width change with θ is opposite for the FDR associated with the drain fingertip. However, some adjacent dilution stripes can be the same stripe width due to a process limit, such as the stripes close to drain in linear drift region. Similarly the dilution stripe spacing can be the same for some adjacent stripes due to a process limit, such as the dilution stripe spacing close to the source in the linear drift region. When the MFLHVT comprises a PMOS device, the dilution will be provided by an n-type buried layer and analogous to the NMOS device described above there will be less n-type buried layer dilution for the PMOS source side and more relative n-type buried layer dilution for the PMOS drain side.

Although NMOS MFLHVTs are generally described above, as noted above one having ordinary skill in the art can use the information disclosed herein for PMOS MFLHVTs by the n-doped regions being substituted by p-doping and vice versa. As used herein, when a diffused region is referred to be doped with a particular dopant type, this means a region in the semiconductor surface where doping concentration of the dopant type referred to (e.g., n-type) is higher than the doping concentration of dopants of the second type (e.g., p-type).

General aspects that make MFLHVTs including LDMOS/DEMOS transistors and processing to form the same can be found in a variety of references, including U.S. Pat. No. 8,470,675 entitled "thick gate oxide for LDMOS and DEMOS" to Sridhar et al., which is incorporated herein by reference. Briefly, a DEMOS transistor has an extended drain by adding a drain drift region between the drain and the channel of the device, trapping the majority of the electric field in this region instead of the channel region, and as used herein also includes a variant known as a Double-Diffused Drain MOS (DDDMOS). A LDMOS transistor uses a drain drift region created by an extra doping similar to the DEMOS transistor structure.

Regarding processing to form a disclosed DBDL, a DBDL layer mask is utilized having a plurality of stripes, such as to print a photoresist pattern with has exposed stripe shaped regions that be stripes. Implantation follows to form diluted buried drift layer stripes, followed by annealing. A drain comprising a plurality of drain fingers is formed interdigitated with a plurality of source fingers each doped the second dopant type. At least a first gate stack is formed on the semiconductor surface between the source and drain.

Advantages of disclosed embodiments include relieving field crowding for triple RESURF HV transistors which lack the top surface layer 174 or quadruple RESURF HV transistors such as MFLHVT 100 shown in FIG. 1A, without compromising the current contribution from the fingertip region resulting from known removal of current conduction path(s). Another advantage is disclosed DBDL designs are equation-based, enabling use for auto-design without the need for any human layout activity. Other advantages include low cost to implement since implementation only involves mask change(s), and there is no need for extra fabrication steps.

EXAMPLES

Disclosed embodiments are further illustrated by the following specific Examples, which should not be construed as limiting the scope or content of this Disclosure in any way. FIG. 3A shows a source or drain finger including a linear finger portion 310 with an associated linear drift region 290 and a fingertip 311 with an associated source FDR 210, with a BDL stripe 320 shown in the linear drift region 290, and FIG. 3B a ½ of the fingertip 311 shown in FIG. 3A now shown as 311a and ½ of the source FDR 210 now shown as 210a, used to show parameters used in disclosed DBDL designs, according to an example embodiment. θ is shown in FIG. 3A and FIG. 3B and is the angle to the location of interest in the FDR, and $L_\theta$ is shown in FIG. 3B which is the distance (length) from the outer edge of the drain MOAT 115 to fingertip center 285. rθnl shown in FIG. 3A is the trajectory of xnl within the source FDR 210 and xnl is one edge of the BDL stripe 320 in the linear drift region 290. rθnl lines up with xnl at θ=0. rs,d is the radius of the fingertip 311 half circle depicted as a solid line as shown in FIG. 3A drawn from the fingertip center 285.

Example $L_\theta$ calculations within the FDR are now described. When θ<arc tangent (arctg) (Lf/L):

$$L_\theta = L/\cos\theta$$

and when π/2>θ>arctg (Lf/L):

$$L_\theta = \frac{L\sin\left(\arcsin\left(\frac{L_f}{L}\cos\theta\right) + \left(\frac{\pi}{2} - \theta\right)\right)}{\cos\theta}$$

An example drift length scaling equation is shown below:

$$\frac{r_{\theta nl} - r_{s,d}}{x_{nl} - r_{s,d}} = \frac{L_\theta - r_{s,d}}{L - r_{s,d}} \Rightarrow r_{\theta nl} = r_{s,d} + \left(\frac{L_\theta - r_{s,d}}{L - r_{s,d}}\right)(x_{nl} - r_{s,d})$$

One then can solve for $L_\theta$, and then solve for rθ (shown as $r_{\theta nl}$) from the above scaling equation, where $r_\theta$ defines how to draw (layout) the edge of each DBDL stripe in the FDR associated with the fingertips for source or drain fingers, such as source FDR 210 described above associated with the source fingertip. As $L_\theta$ increases, $r_{\theta nl}$ increases which increases the width of the DBDL stripes. The width of non-implanted regions (gaps) between the DBDL stripes also increases with $L_\theta$. L=DL+rs,d; DL=L−rs,d is the constant drift length in the linear drift region. $L_\theta$=$DL_\theta$+rs,d, $DL_\theta$=$L_\theta$−rs,d is the drift region in the FDR.

In FIG. 2B which shows the case of a source FDR 210 for an NMOS device, each of the 15 DBDL stripes shown as DBDL 132a within the source FDR 210 has a width that varies with θ, specifically increasing in width with increasing θ having a maximum width at 90 degrees, and being symmetric in its width pattern relative to the 90 degree line. The equations above generate such a distribution since as θ increases $L_\theta$ increases, which increases $r_{\theta nl}$ that increases the width of the DBDL stripes.

Figure 4:
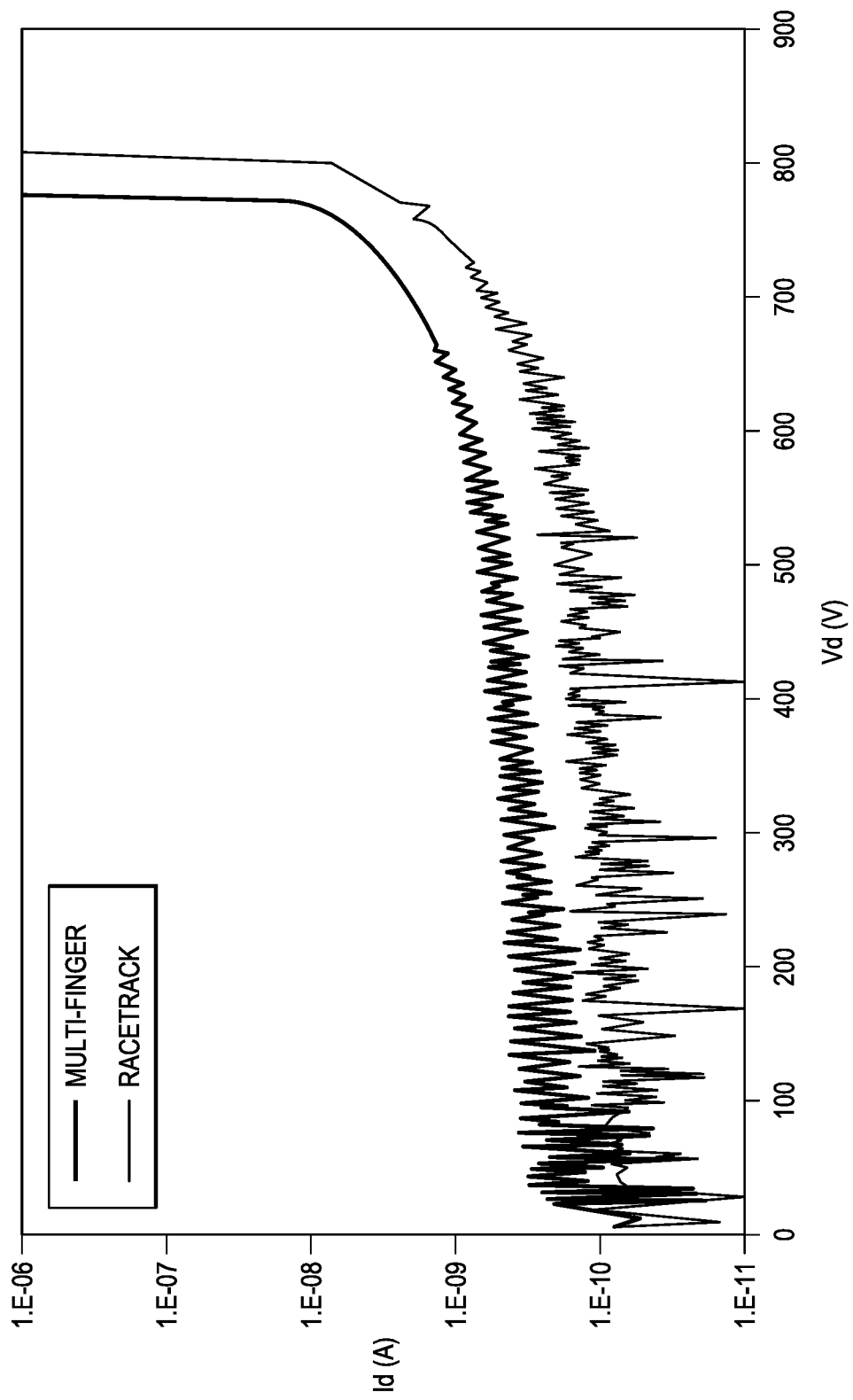
FIG. 4 shows comparative NLDMOS BVDSS data including data from a disclosed multi-finger NLDMOS device having a disclosed DBDL design having a MIOD such as shown in FIG. 2B, and a control racetrack NLDMOS device having a conventional DBDL having a fixed stripe overdesign dimension.

FIG. 4 shows comparative NLDMOS BVDSS data including the BVDSS from a multi-finger NLDMOS device having a disclosed DBDL having a variable stripe width overdesign dimension in the FDR such as shown in FIG. 2B, and a control racetrack NLDMOS device having a conventional DBDL having a fixed stripe width overdesign dimension. The BVDSS difference between multi-finger and racetrack (single finger) NLDMOS device layouts is seen to be only about 40V, vs. in excess of over a 100 V reduction for multi-finger NLDMOS device having a DBDL design having a fixed stripe overdesign dimension.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of forming a lateral power MOS transistor, comprising
providing a substrate doped with a first dopant type having a well thereon doped a second dopant type with a semiconductor surface doped said second dopant type on said well;
forming dielectric isolation regions at least partially in said semiconductor surface having gaps defining a first active area in a first dielectric gap region (first MOAT) and a second active area in a second dielectric gap region (second MOAT);
forming a buried drift layer (BDL) doped said first dopant type having a diluted BDL portion (DBDL) including a plurality of dilution stripes, comprising:
forming a masking pattern using a diluted BDL mask having said plurality of dilution stripes with respective stripe widths that increase monotonically with a drift length at their respective positions, and
implanting using said masking pattern;
forming a drain comprising a plurality of drain fingers having drain fingertips in said second MOAT interdigitated with a source comprising a plurality of source fingers having source fingertips in said first MOAT each doped said second dopant type;
wherein said DBDL is within a fingertip drift region (FDR) associated with at least one of said drain fingertips (drain FDR) and said source fingertips (source FDR) between said first MOAT and said second MOAT, and forming at least a first gate stack on said semiconductor surface between said source and said drain.

2. The method of claim 1, wherein said respective stripe widths increase with an increasing angle θ relative to a boundary of said FDR with a linear drift region having a maximum width at 90 degrees.

3. The method of claim 1, wherein said FDR includes said source FDR and said drain FDR.

4. The method of claim 1, further comprising forming a top surface layer in said semiconductor surface doped said first dopant type.

5. The method of claim 1, wherein said first gate stack comprises a split-gate including a first gate stack and a second gate stack lateral to said first gate stack.

* * * * *